United States Patent [19]

Motamedi et al.

[11] Patent Number: 4,746,398
[45] Date of Patent: May 24, 1988

[54] GALLIUM ARSENIDE PLANAR TUNNEL DIODE METHOD

[75] Inventors: Hormoz M. Motamedi; John G. Richards; Hector H. Flores, all of San Jose, Calif.

[73] Assignee: FEI Microwave, Inc., Sunnyvale, Calif.

[21] Appl. No.: 63,376

[22] Filed: Jun. 18, 1987

Related U.S. Application Data

[62] Division of Ser. No. 842,584, Mar. 21, 1986, abandoned.

[51] Int. Cl.⁴ .................. B44C 1/22; H01L 21/58; H01L 21/60; C03C 15/00
[52] U.S. Cl. .................... 156/644; 156/657; 156/659.1; 156/662; 437/72; 437/192; 437/202; 437/235
[58] Field of Search ............ 156/644, 653, 657, 659.1, 156/662; 437/3, 31, 55, 72, 78, 90, 134, 160, 192, 202, 235, 245; 357/12, 15, 21, 29, 67, 71, 76

[56] References Cited

U.S. PATENT DOCUMENTS

| | | | |
|---|---|---|---|
| 4,179,533 | 12/1979 | Christou et al. | 437/192 X |
| 4,187,599 | 2/1980 | Flowers et al. | 437/192 X |
| 4,307,131 | 12/1981 | Moutou et al. | 156/662 X |

Primary Examiner—William A. Powell

[57] ABSTRACT

A gallium arsenide tunnel diode is fabricated using planar techniques from a wafer of gallium arsenide that has been heavily doped to form a P region. Tin is plated onto an exposed section of a surface of the wafer and then melted to cause individual tin atoms to diffuse only a few atomic layers into the wafer, creating a heavily doped N region. Metal contact layers are then formed over the tin and on the opposite surface of the wafer. An oxidation inhibitor is used during the plating and a scavenging agent is used during the melting to insure intimate contact between the tin and the wafer.

4 Claims, 1 Drawing Sheet

GALLIUM ARSENIDE PLANAR TUNNEL DIODE METHOD

This is a division of application Ser. No. 842,584, filed Mar. 21, 1986, now abandoned.

BACKGROUND OF THE INVENTION

The present invention relates generally to semiconductor diodes and, more particularly, to tunnel diodes fabricated of gallium arsenide.

A tunnel diode is a diode having a P-N junction formed between a heavily doped P region and a heavily doped N region of a semiconductor, one of the regions being very thin.

In accordance with well known principles, majority charge carriers can travel across such a junction despite an opposing potential barrier created by a voltage applied to the junction, a process known as "tunneling." Tunneling takes place only over a limited range of applied voltages, however, and as the forward voltage is increased, the barrier height decreases beyond a certain magnitude and current flow due to tunneling drops off rapidly. Such as inverse relationship between applied voltage and current flow is sometimes called a "negative resistance" characteristic. A negative resistance characteristic is desirable because a device having such a characteristic can be made to oscillate or to amplify. Tunnel diodes are especially useful because they combine a negative resistance characteristic with an ability to function well at microwave frequencies, and hence tunnel diodes find a variety of applications in microwave circuits as oscillators, amplifiers, and the like.

Tunnel diodes fabricated by means of planar technology (that is, formed in one side of a wafer of semiconductor material) have certain advantages over those made by means of mesa, ball-alloy, or electronic pulse techniques. Among these advantages are a more rugged and mechanically stable construction, and more economical manufacture because planar technology leads to larger volume, and a higher production yield. Also, planar tunnel diodes are more reliable and have more predictable electrical characteristics. Prior to this invention, gallium arsenide has not lent itself to planar fabrication techniques, and the only practical planar tunnel diodes have been made of germanium. Unfortunately, germanium planar tunnel diodes are not capable of operation at sufficiently high power or at sufficiently high temperatures to be usable for radio-frequency (rf) detector applications in flight. Tunnel diodes fabricated from gallium arsenide can function under these conditions, but some other construction technique not offering the advantages of planar construction has been used to make such diodes.

It will be apparent from the foregoing that there is a need for a planar tunnel diode that can be used in flight for rf detector applications or in other applications requiring gallium arsenide tunnel diodes. The present invention satisfies this need.

SUMMARY OF THE INVENTION

The present invention resides in a gallium arsenide planar tunnel diode and a related method for its fabrication. The diode of the invention combines the power handling capacity and temperature stability of gallium arsenide with the superior characteristics that result from fabrication by means of planar technology.

In accordance with the method of the invention, a tunnel diode is fabricated from a gallium arsenide wafer that has been heavily doped with zinc to form a P region. First, an insulating layer of silicon dioxide is grown on an upper surface of the wafer, and masking and etching techniques are used to make an opening through the insulating layer. Next, tin is plated onto the wafer through the opening. Then the tin is melted, causing individual tin atoms to diffuse into the wafer to a depth of several atomic layers below the surface, forming within that depth a heavily doped N region. A P-N junction is formed at the boundary between the N region and the surrounding P region. Finally, electrical connections are affixed to a lower surface of the wafer (the anode) and to the tin (the cathode).

The presence of even a very thin oxide film between the tin and the gallium arsenide wafer during the plating or melting will result in a resistive contact instead of a P-N junction. Therefore, it is critically important that no oxides be present during these steps. However, both tin and gallium arsenide are highly susceptible to oxidation, and accordingly special techniques must be used to prevent oxidation. In the present invention, oxidation is prevented by plating the tin onto the wafer in a solution containing sulfuric acid and by heating the tin and the wafer in a scavenging atmosphere while the tin melts and covers the entire exposed upper surface of the wafer.

It will be appreciated from the foregoing that the present invention represents a significant advance in the field of tunnel diodes. In particular, a gallium arsenide tunnel diode is fabricated according to the invention by means of planar technology, thereby combining in a tunnel diode the desirable qualities of gallium arsenide with the advantages stemming from fabrication by planar techniques. Other aspects and advantages of the invention will become apparent from the following more detailed description taken in conjunction with the accompanying drawing.

DESCRIPTION OF THE PREFERRED EMBODIMENT

Figure 1:
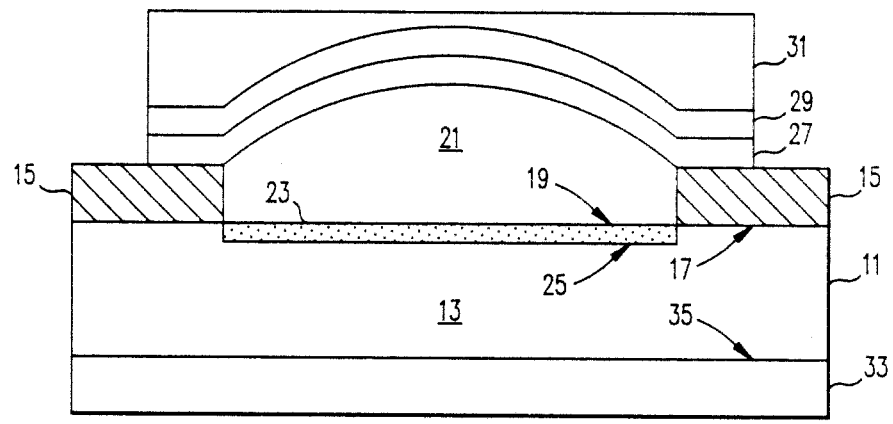
FIG. 1 is a cross-sectional view of a tunnel diode according to the invention.

The present invention provides a device that combines the desirable operating characteristics of a tunnel diode made from gallium arsenide with the superior qualities of a diode fabricated by means of planar technology, a combination that has not previously been attainable.

In accordance with the invention, a tunnel diode is fabricated from a gallium arsenide wafer 11 that has been heavily doped with zinc to form a P region 13, as shown in FIG. 1. A layer of silicon dioxide 15 is vapox grown on an upper surface 17 of the wafer 11. The silicon dioxide 15 is covered with photoresist, masked, and etched to expose a window section 19 of the surface 17. A globule of tin 21 is plated onto the exposed window section 19 in a plating bath. Then the tin 21 is melted, causing some of the tin atoms to diffuse a depth of several atomic layers into the wafer 11, forming within that depth a heavily doped N region 23. A P-N junction 25 is thereby created between the N region 23 and the P region 13.

A layer of titanium-tungsten alloy 27 is deposited on the tin 21, a layer of gold 29 is deposited on the alloy 27, and a gold-plated contact 31 is, in turn, affixed to the layer 29 to provide an electrical connection with the tin. A nickel-chromium and gold alloy contact 33 is applied to a lower surface 35 of the wafer 11 to establish an electrical connection.

If an oxide film comes between the tin 21 and any point on the exposed surface section 19 before the tin atoms diffuse into the surface, the tin atoms will be blocked from diffusing at that point and a resistive contact will be created between the tin and the P region 13. To insure that this does not happen, oxidation during the plating and melting of the tin must be prevented. Such harmful oxidation can be prevented by adding a weak concentration of sulfuric acid to the plating bath before the wafer 11 is immersed in it, and by withdrawing the wafer from the plating bath directly into a scavenging atmosphere and keeping it there during the melting of the tin. The tin can be melted at a temperature of about 450 degrees Celsius, and at this temperature an atmosphere composed of hydrogen as a scavenging agent mixed with nitrogen in a ratio of about three parts hydrogen to seven parts nitrogen gives good results.

Before the wafer 11 is immersed in the plating bath, a temporary layer of gold is deposited on the lower surface 35 to prevent tin from plating onto that surface, but this temporary layer is removed prior to application of the contact 33. Any excess metal left over from the deposit of the tin-tungsten alloy 27 or the gold 29 on the tin 21 is removed by masking and etching before the contact 31 is affixed.

A gallium arsenide planar tunnel diode according to the present invention can handle power levels greater than 20 dBm at temperatures in excess of 125 degrees Celsius and is well suited for use as a backward diode in rf detector applications in flight. Such a diode also makes a superior detector with low level shot noise because it displays a current-voltage characteristic having a strong curvature at zero bias and a peak current between 300 and 600 microamperes. In addition it has a large dynamic range and therefore finds numerous applications as an amplifier or as an oscillator.

It will be appreciated from the foregoing that the present invention represents a significant advance in the field of tunnel diodes. In particular, the invention provides a tunnel diode on gallium arsenide using planar fabrication techniques. It will also be appreciated that, although a specific embodiment of the invention has been described in detail for purposes of illustration, various modifications may be made without departing from the spirit and scope of the invention. Accordingly, the invention is not to be limited except as by the appended claims.

We claim:

1. A method for making a gallium arsenide planar tunnel diode comprising the steps of:
    heavily doping a wafer of gallium arsenide to form a P region;
    forming an insulating layer on an upper surface of the wafer;
    making an opening through the insulating layer;
    applying tin through the opening onto the exposed upper surface of the wafer in the presence of an oxidization inhibitor, the inhibitor being operative to prevent either the tin or the surface of the wafer from oxidizing and thereby to ensure intimate contact between the tin and the surface of the wafer;
    applying heat to the tin and the wafer in the presence of a scavenging agent to melt the tin on the surface of the wafer and thereby cause individual atoms of the tin to diffuse into the upper surface of the wafer a distance of several atomic layers to form a heavily doped N region, the scavenging agent being operative to prevent oxidation of either the tin or the wafer; and
    applying an electrical contact material to the tin.

2. A method for making a gallium arsenide planar tunnel diode comprising the steps of:
    heavily doping a wafer of gallium arsenide with zinc to form a P region;
    growing a layer of silicon dioxide on an upper surface of the slab;
    applying photoresist to, masking, and etching the silicon dioxide to make an opening therethrough;
    plating tin onto the exposed upper surface of the wafer in a plating solution having a weak concentration of sulfuric acid, the acid being operative to prevent either the tin or the surface of the wafer from oxidizing, and thereby to ensure intimate contact between the tin and the surface of the wafer;
    after the plating step, placing the wafer in an atmosphere containing hydrogen;
    applying heat to the tin and the wafer to melt the tin on the surface of the wafer and thereby cause individual atoms of the tin to diffuse into the upper surface of the wafer a distance of several atomic layers to form a heavily doped N region, the hydrogen being operative to prevent oxidation of either the tin or the wafer; and
    applying electrical contact metal to the tin.

3. A method according to claim 2, wherein the contact metal includes an alloy of titanium and tungsten.

4. A method according to claim 3 and further comprising the step of:
    applying electrical contact metal to the lower surface of the wafer.